(12) United States Patent
Ko et al.

(10) Patent No.: US 11,774,508 B2
(45) Date of Patent: Oct. 3, 2023

(54) BATTERY MANAGEMENT SYSTEM AND BATTERY MANAGEMENT METHOD THEREOF

(71) Applicant: SK On Co., Ltd., Seoul (KR)

(72) Inventors: Kyung Chul Ko, Daejeon (KR); Jeong Min Seo, Daejeon (KR); Byung Eun Lee, Daejeon (KR)

(73) Assignee: SK On Co., Ltd., Seoul (KR)

( * ) Notice: Subject to any disclaimer, the term of this patent is extended or adjusted under 35 U.S.C. 154(b) by 377 days.

(21) Appl. No.: 17/167,195

(22) Filed: Feb. 4, 2021

(65) Prior Publication Data
US 2021/0247457 A1 Aug. 12, 2021

(30) Foreign Application Priority Data
Feb. 7, 2020 (KR) .......................... 10-2020-0014697

(51) Int. Cl.
| | | |
|---|---|---|
| G01R 31/3842 | (2019.01) | |
| H01M 10/42 | (2006.01) | |
| G01R 31/392 | (2019.01) | |
| G01R 31/36 | (2020.01) | |

(52) U.S. Cl.
CPC ..... *G01R 31/3842* (2019.01); *G01R 31/3648* (2013.01); *G01R 31/392* (2019.01); *H01M 10/425* (2013.01); *H01M 2010/4271* (2013.01)

(58) Field of Classification Search
CPC ............ G01R 31/3842; G01R 31/3648; G01R 31/392; G01R 31/396; G01R 31/3835; G01R 19/16542; G01R 31/389; H01M 10/425; H01M 2010/4271; H01M 10/441; H01M 10/482; H01M 10/486; H01M 2010/4278; Y02E 60/10
See application file for complete search history.

(56) References Cited

U.S. PATENT DOCUMENTS

| | | | |
|---|---|---|---|
| 11,411,391 B2* | 8/2022 | Jung | H02J 7/00308 |
| 11,624,787 B2* | 4/2023 | Uchino | H01M 10/48 320/137 |
| 2021/0249852 A1* | 8/2021 | Jung | H02J 7/0029 |
| 2021/0286018 A1* | 9/2021 | Jeong | G01R 31/382 |
| 2021/0367440 A1* | 11/2021 | Han | H01M 50/583 |
| 2022/0287531 A1* | 9/2022 | Ng | A47L 9/2836 |
| 2022/0365139 A1* | 11/2022 | Altaf | B60L 3/12 |

FOREIGN PATENT DOCUMENTS

KR 1020130110355 A 10/2013

* cited by examiner

*Primary Examiner* — Stacy Whitmore
(74) *Attorney, Agent, or Firm* — THE WEBB LAW FIRM

(57) ABSTRACT

Provided is a battery management system and method for selecting at least one battery cell of a high-risk group and calculating a maximum current limit value for stably using a battery pack using the selected at least one battery cell of the high-risk group. According to the present invention, the battery cells of high-risk group may be selected and managed by calculating a maximum voltage change amount of a plurality of battery cells, and the battery pack may be stably used by calculating a maximum current limit value that prevents the battery cell from being out of an operating voltage range to have a maximum margin.

18 Claims, 10 Drawing Sheets

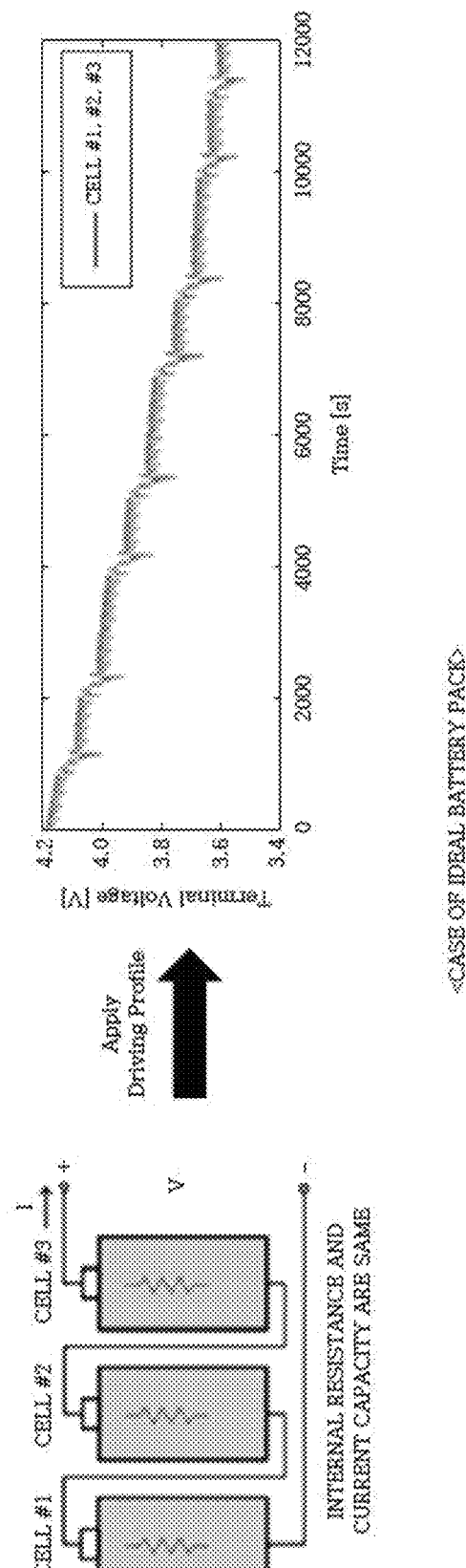
[Fig. 1A]

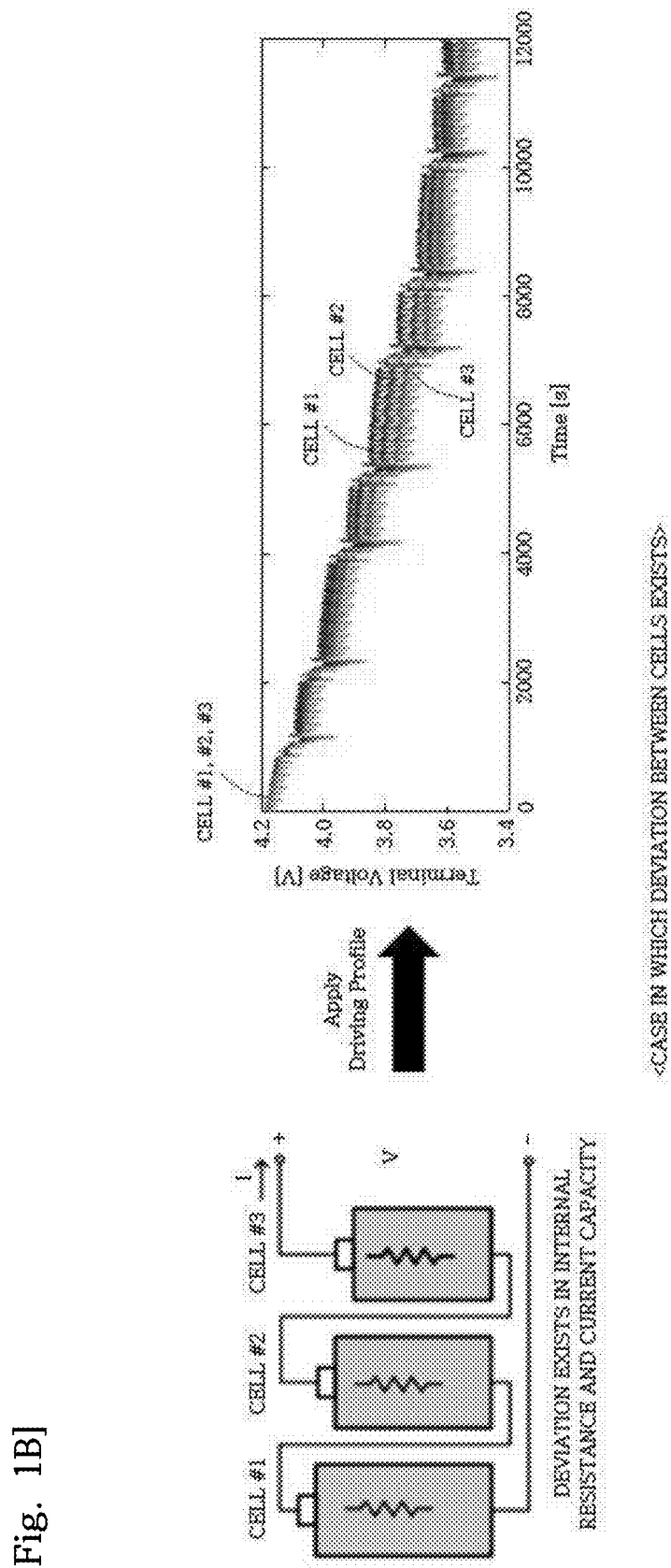
[Fig. 1B]

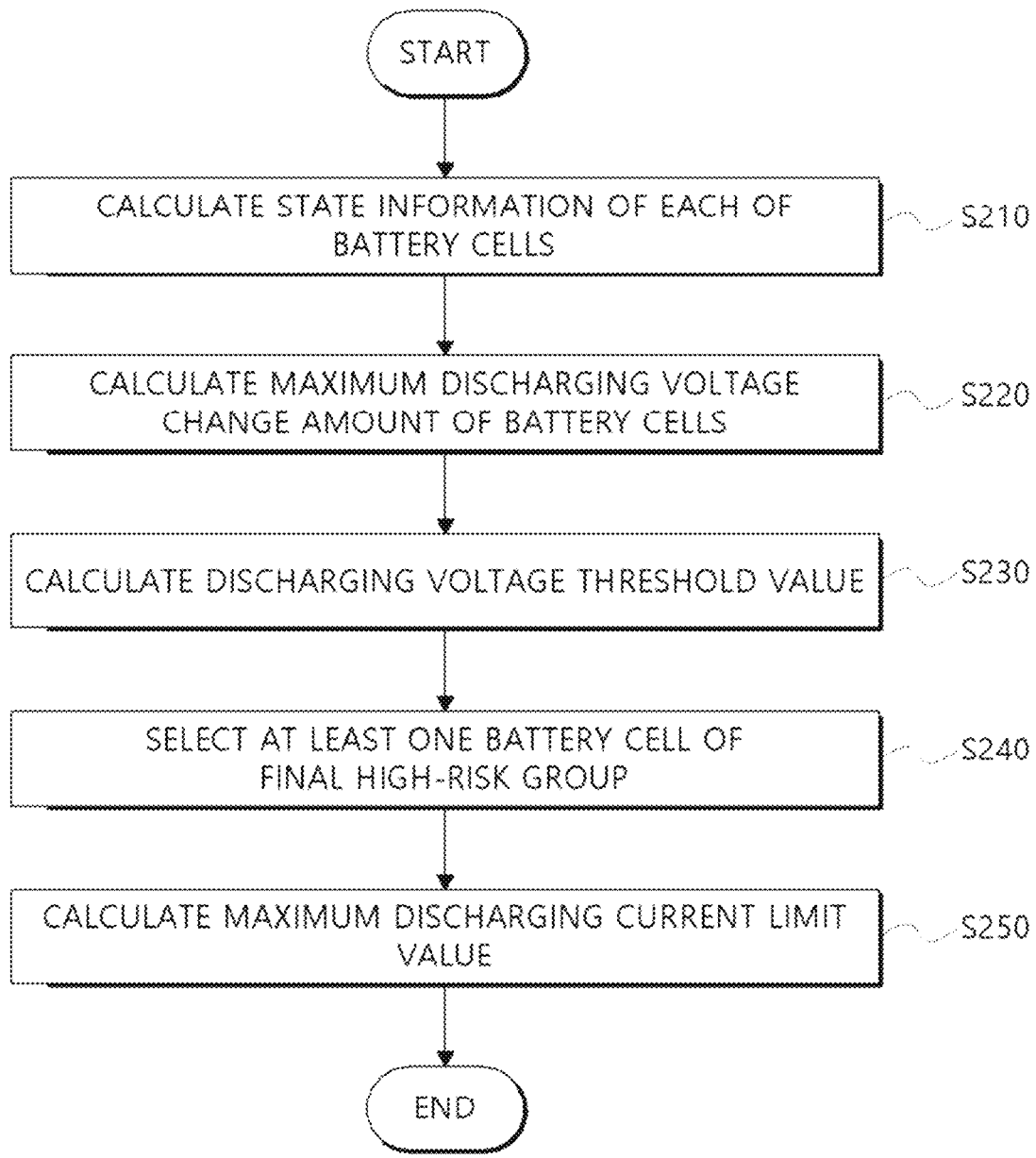

BATTERY MANAGEMENT SYSTEM AND BATTERY MANAGEMENT METHOD THEREOF

CROSS-REFERENCE TO RELATED APPLICATION

This application claims priority to Korean Patent Application No. 10-2020-0014697 filed Feb. 7, 2020, the disclosure of which is hereby incorporated by reference in its entirety.

BACKGROUND OF THE INVENTION

Field of the Invention

The following disclosure relates to a battery management system and a battery management method for selecting at least one battery cell of a high-risk group that has a risk of being out of an operating voltage range among a plurality of battery cells constituting a battery pack, and calculating a current limit value allowed for the battery pack using the at least one battery cell of the high-risk group.

Description of Related Art

As a general method of estimating a state (SoC: State of Charge, SoH: State of Health, etc.) of a battery used in an electric vehicle, there is a method of determining the state of the battery by selecting values representing a plurality of battery cells (representative voltage, representative internal resistance, representative capacity, etc.).

A battery management system (BMS) adjusts a current flowing through a battery pack so that the battery is charged and discharged between an upper limit voltage during charging and a lower limit voltage during discharging using the determined battery state. This is because if the voltage of the battery cell is repeatedly out of a boundary of the upper and lower limit voltages, that is, an operating voltage range during charging and discharging, the battery cell deteriorates and negatively affects a life of the battery. However, in an actual battery pack, there are variations in the state between the battery cells from the beginning of production, and such variation may further increase as the electric vehicle is driven. When the deviation between the battery cells increases in this way, an error also increases in an estimation of the battery state using the values representing the plurality of battery cells.

FIG. 1A illustrates a change in a terminal voltage over time in the case of an ideal battery pack. Referring to FIG. 1A, since each battery cell included in the ideal battery pack has the same internal resistance and current capacity, a constant rate of decrease of the terminal voltage over time, and the same terminal voltage, there is no problem in determining the state of the battery through the representative value.

In contrast, FIG. 1B illustrates a change in a terminal voltage over time in the case of an actual battery pack. Referring to FIG. 1B, since the internal resistance, current capacity, and the like of each battery cell included in the actual battery pack are different from each other and the rates of decrease of the terminal voltage over time are different from each other, the deviation in a value of the terminal value of each battery cell becomes severe as time passes. Therefore, in the case of determining the state of the battery by representing any one cell or determining the state of the battery through an average value of the battery cells, a battery that first reaches an upper limit voltage of charging during charging or a battery that first reaches a lower limit voltage of discharging during discharging occurs. In this way, the battery that is out of the operating voltage range continuously deteriorates, and eventually an efficiency of the entire battery pack, as well as stability of the battery pack, may decrease, resulting in a risk that the electric vehicle stops while being driven.

Therefore, in order to prevent such a risk, it is necessary to grasp the state of each of the plurality of battery cells constituting the battery pack, and it is necessary to select at least one battery cell of a high-risk group that has a possibility of deteriorating by first reaching the upper or lower limit value of the operating voltage among the battery cells and limit a current flowing through the at least one battery cell of the high-risk group.

RELATED ART DOCUMENT

Patent Document (Patent Document 1) KR 10-2013-0110355 A

SUMMARY OF THE INVENTION

An embodiment of the present invention is directed to providing a device and method capable of calculating an actual usable capacity of a battery pack.

Further, an embodiment of the present invention is directed to providing a device and method capable of selecting and managing at least one battery cell of a high-risk group, among a plurality of battery cells, which has a possibility of deteriorating by first reaching an upper limit value or a lower limit value of an operating voltage.

Further, an embodiment of the present invention is directed to providing a device and method for accurately calculating a current limit value that prevents battery cells from being out of an operating voltage range.

In one general aspect, a battery management system comprising: a state information calculation unit configured to calculate state information of each of a plurality of battery cells; and a cell selection unit configured to select at least one battery cell of a high-risk group using the state information, wherein the at least one battery cell of the high-risk group includes a battery cell having a terminal voltage that is out of an operating voltage during a charge or a discharge, and the cell selection unit calculates a maximum voltage change amount of the plurality of battery cells, calculates a voltage threshold value serving as a reference for selecting the at least one battery cell of the high-risk group by using the maximum voltage change amount, and selects the at least one battery cell of the high-risk group based on the voltage threshold value.

The state information calculation unit may receive at least one of a voltage of each of the battery cells, a current of the battery pack, and a temperature of the battery pack from the battery pack, and calculate at least one of a state of charge (SoC), a state of health (SoH), and an internal resistance of each of the battery cells as the state information.

The cell selection unit may calculate a maximum charging voltage change amount by using a difference value between a current open terminal voltage and an open terminal voltage when fully charged of a battery cell having the lowest SoH among the plurality of battery cells, an internal resistance value of a battery cell having the largest internal resistance among the plurality of battery cells, and a maximum current that flows through the plurality of cells during charging, calculate a value obtained by adding the maximum charging voltage change amount to an upper limit value of the operating voltage as a charging voltage threshold value, and select at least one battery cell having a terminal voltage smaller than the upper limit value and greater than the charging voltage threshold value as the at least one battery cell of the high-risk group.

The battery management system may further include a current calculation unit configured to calculate a maximum charging current limit value for preventing the terminal voltage of each of the plurality of battery cells from being charged while exceeding the upper limit value of the operating voltage during charging, wherein the current calculation unit calculates the maximum charging current limit value by using a current open terminal voltage of a battery cell having the largest SoC among the selected at least one battery cell of the high-risk group, a difference value between a current open terminal voltage and an open terminal voltage when fully charged of a battery cell having the smallest SoH, and a polarization voltage of a battery cell having the largest terminal voltage.

The cell selection unit may select a battery cell having the lowest SoH among the plurality of battery cell, calculate a maximum discharging voltage change amount by using a difference value between a current open terminal voltage and an open terminal voltage when fully discharged of the selected battery cell, an internal resistance value of a battery cell having the largest internal resistance among the plurality of battery cells, and a maximum current that flows through the plurality of battery cells during discharging, calculate a value obtained by adding the maximum discharging voltage change amount to a lower limit value of the operating voltage as a discharging voltage threshold value, and select at least one battery cell having a terminal voltage greater than the lower limit value and smaller than the discharging voltage threshold value as the at least one battery cell of the high-risk group.

The battery management system may further include a current calculation unit configured to calculate a maximum discharging current limit value for preventing the terminal voltage of each of the plurality of battery cells from being less than a lower limit value of the operating voltage during discharging, wherein the current calculation unit calculates the maximum discharging current limit value by using a current open terminal voltage of a battery cell having the smallest SoC among the selected at least one battery cell of the high-risk group, a difference value between a current open terminal voltage and an open terminal voltage when fully discharged of a battery cell having the smallest SoH, and a polarization voltage of a battery cell having the smallest terminal voltage.

In another general aspect, a battery management method, the method comprising: calculating state information of each of a plurality of battery cells; calculating a maximum voltage change amount of the plurality of battery cells by using the state information; calculating a voltage threshold value serving as a reference for selecting the least one battery cell of a high-risk group by using the maximum voltage change amount; and selecting the at least one battery cell of the high-risk group based on the voltage threshold value, wherein the at least one battery cell of the high-risk group includes a battery cell having a terminal voltage that is out of an operating voltage during a charge or a discharge.

In the calculating of the state information of each of the plurality of battery cells, at least one of a voltage of each of the battery cells, a current of the battery pack, and a temperature of the battery pack is received from the battery pack, and at least one of a SoC, a SoH, and an internal resistance of each of the battery cells may be calculated as the state information.

In the calculating of the maximum voltage change amount, a maximum charging voltage change amount may be calculated by using a difference value between a current open terminal voltage and an open terminal voltage when fully charged of a battery cell having the lowest SoH among the plurality of battery cells, an internal resistance value of a battery cell having the largest internal resistance among the plurality of battery cells, and a maximum current that flows through the plurality of cells during charging.

In the calculating of the voltage threshold value, a value obtained by adding the maximum charging voltage change amount to an upper limit value of the operating voltage may be calculated as a charging voltage threshold value.

In the selecting of at least one the battery cell of the high-risk group, at least one battery cell having a terminal voltage smaller than the upper limit value and greater than the charging voltage threshold value may be selected as the at least one battery cell of the high-risk group.

The battery management method may further include, after the selecting of the at least one battery cell of the high-risk group, calculating a maximum charging current limit value for preventing the terminal voltage of each of the plurality of battery cells from being charged while exceeding the upper limit value of the operating voltage during charging.

In the calculating of the maximum current limit value, the maximum charging current limit value may be calculated by using a current open terminal voltage of a battery cell having the largest SoC among the selected at least one battery cell of the high-risk group, a difference value between a current open terminal voltage and an open terminal voltage when fully charged of a battery cell having the smallest SoH, and a polarization voltage of a battery cell having the largest terminal voltage.

In the calculating of the maximum voltage change amount, a battery cell having the lowest SoH among the plurality of battery cell may be selected, and a maximum discharging voltage change amount may be calculated by using a difference value between a current open terminal voltage and an open terminal voltage when fully discharged of the selected battery cell, an internal resistance value of a battery cell having the largest internal resistance among the plurality of battery cells, and a maximum current that flows through the plurality of battery cells during discharging.

In the calculating of the voltage threshold value, a value obtained by adding the maximum discharging voltage change amount to a lower limit value of the operating voltage may be calculated as a discharging voltage threshold value.

In the selecting of the at least one battery cell of the high-risk group, at least one battery cell having a terminal voltage greater than the lower limit value and smaller than the discharging voltage threshold value may be selected as the at least one battery cell of the high-risk group.

The battery management method may further include, after the selecting of the at least one battery cell of the high-risk group, calculating a maximum discharging current limit value for preventing the terminal voltage of each of the plurality of battery cells from being less than a lower limit value of the operating voltage during discharging.

In the calculating of the maximum current limit value, the maximum discharging current limit value may be calculated by using a current open terminal voltage of a battery cell having the smallest SoC among the selected at least one battery cell of the high-risk group, a difference value between a current open terminal voltage and an open terminal voltage when fully discharged of a battery cell having the smallest SoH, and a polarization voltage of a battery cell having the smallest terminal voltage.

BRIEF DESCRIPTION OF THE DRAWINGS

FIG. 1A is a diagram illustrating a change in a terminal voltage over time in battery cells included in an ideal battery pack.

FIG. 1B is a diagram illustrating a change in a terminal voltage over time in battery cells included in an actual battery pack.

FIG. 9 is a flowchart illustrating a second embodiment in which the battery pack is discharged in the battery management method according to the present invention.

DESCRIPTION OF THE INVENTION

Hereinafter, the present invention will be described in detail with reference to the accompanying drawings. A detailed description for the well-known functions and configurations that may unnecessarily make the gist of the present invention unclear will be omitted.

In addition, a term "unit", "module", or the like described in the specification means a unit that processes at least one function or operation and may be implemented by hardware or software or a combination of hardware and software.

Figure 2:
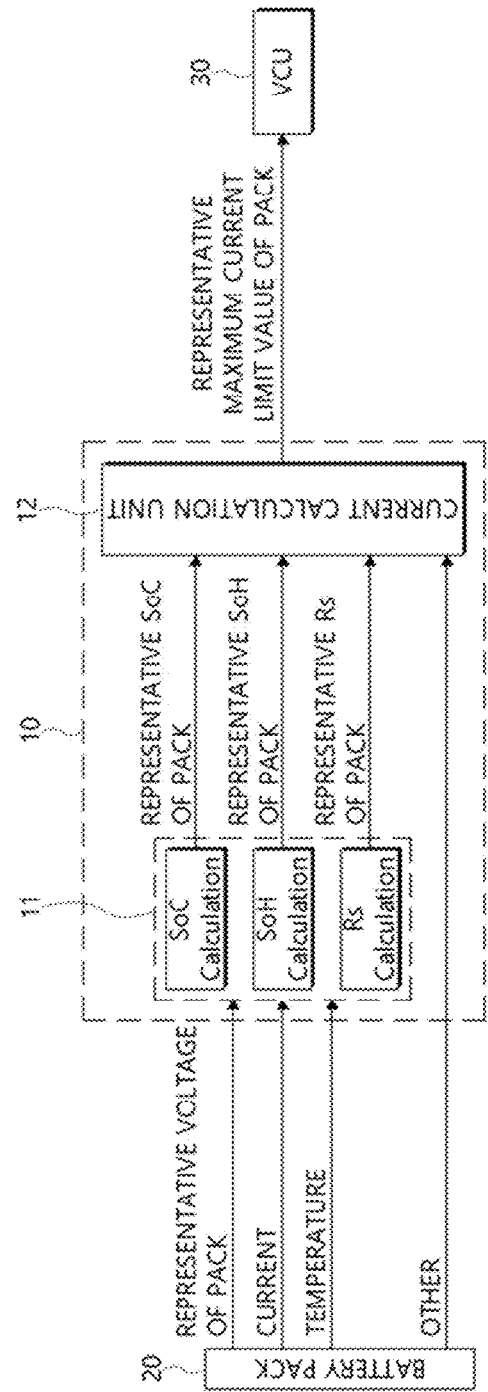
FIG. 2 is a diagram illustrating a conventional battery management system (BMS).

FIG. 2 is a diagram illustrating a conventional battery management system.

Referring to FIG. 2, a conventional battery management system 10 receives the representative pack voltage, current, and temperature from a battery pack 20, and a state information calculation unit 11 calculates a representative state of charge (SoC) of the battery pack, a representative state of health (SoH) of the battery pack 20, and a representative internal resistance $R_s$ of the battery pack 20. A maximum current limit value for allowing the battery pack 20 to be charged and discharged within an operating voltage range may be calculated by the current calculation unit 12 using the representative SoC, the representative SoH, and the representative internal resistance $R_s$ calculated in this way, and a load is adjusted so that the maximum current limit value is transmitted to a vehicle control unit (VCU) 30 and a current within the maximum current limit value flows through the battery pack 20.

At this time, the load may be an inverter for controlling a motor, a charging device for charging the battery pack 20, or the like.

However, as described above, in the case of the actual battery pack that is unlike the ideal battery pack, since the internal resistance Rs, current capacity, and the like of each battery cell included in the battery pack are different from each other, the rate of decrease of the terminal voltage over time is different from each other, and the deviation of the terminal voltage becomes severe as time passes.

Therefore, for the stability and efficiency of the battery pack, it is necessary to select and specially manage at least one battery cell of a high-risk group, among the battery cells, which has a possibility of deteriorating by first reaching an upper limit value or a lower limit value of an operating voltage.

In addition, in order to give a maximum margin to a limit value of a current allowed for the battery pack to calculate an accurate maximum current limit value that any battery is not out of the operating voltage range, it is necessary to select the at least one battery cell of the high-risk group.

Figure 3:
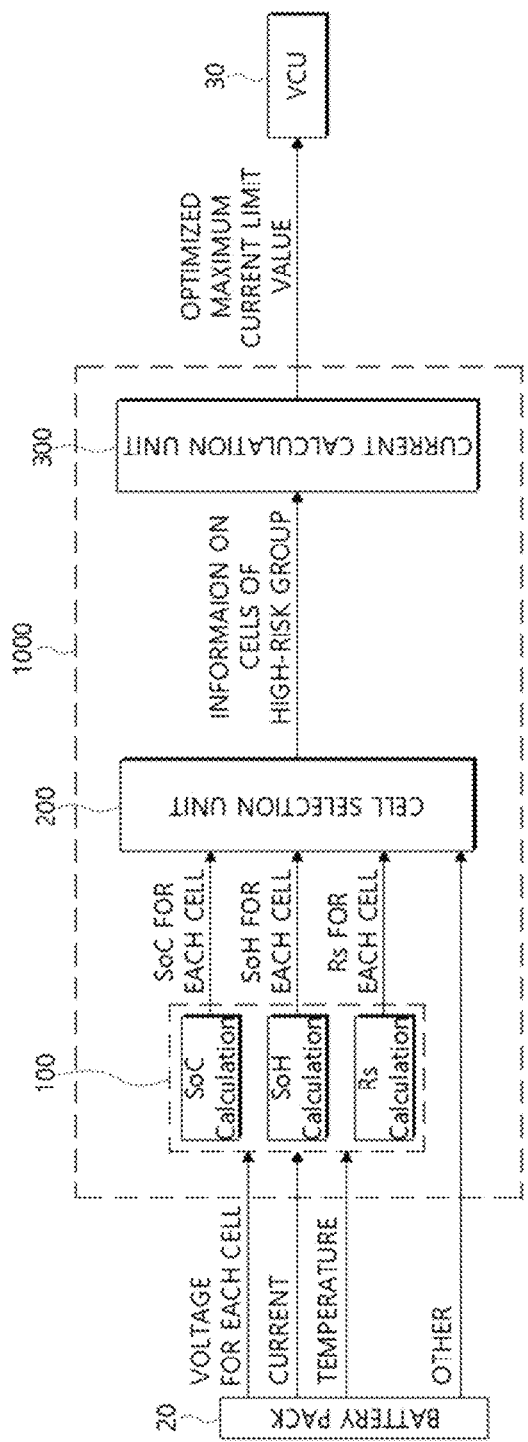
FIG. 3 is a diagram schematically illustrating a battery management system according to the present invention.

FIG. 3 is a diagram schematically illustrating a battery management system 1000 according to the present invention.

Referring to FIG. 3, the battery management system 1000 according to the present invention includes a state information calculation unit 100, a cell selection unit 200, and a current calculation unit 300.

According to the present invention, the maximum current value is not calculated by calculating the state information representing the battery pack 20 as in the conventional battery management system 10, but the state information is calculated for each of the plurality of battery cells and the at least one battery cell of the high-risk battery group is selected by using the calculated state information, and therefore, an optimized maximum current limit value that prevents an occurrence of a battery out of the operating voltage range during charging and discharging may be calculated based on such at least one battery cell of the high-risk group.

At this time, the operating voltage range is a voltage range in which the battery cells may be stably charged and discharged without deterioration, and an upper limit value of the operating voltage may be 4.2 V and a lower limit value thereof may be 2.7 V, which may be predetermined values.

In the following, each component of the battery management system 1000 of the present invention will be described in more detail.

The state information calculation unit 100 is a component that calculates state information of each of a plurality of battery cells included in the battery pack 20.

Here, the state information calculation unit 100 may receive at least one of the voltage of each of the battery cells included in the battery pack 20, the current of the battery pack 20, and the temperature of the battery pack 20 from the battery pack 20, and may calculate at least one of a state of charge (SoC), a state of health (SoH), and an internal resistance $R_s$ of each of the battery cells as state information. The state information of each of the battery cells thus calculated is transmitted to a cell selection unit 200 to select the at least one battery cell of the high-risk group.

Meanwhile, in the present invention, the internal resistance refers to a specific resistance of each battery cell, and when the same current flows through each battery cell, a charged voltage or an available voltage decreases as the battery cell has a higher internal resistance, thereby reducing use efficiency of the battery cell. The internal resistance may have a different value for each battery cell according to a tolerance at the beginning of production of the battery cell or a degree of deterioration due to driving. Such an internal resistance may be calculated by various known techniques. For example, the internal resistance may be calculated using a direct current internal resistance (DCIR) measurement technique that applies charge/discharge current to each battery cell in the form of pulses for a certain period of time, measures a voltage change amount and a current change amount appearing in each battery cell, and converts the voltage change amount and the current change amount into resistance values.

Further, since a method of calculating the SoC, the SoH, and the like using the voltage, the current, the temperature, etc. is a known technique, a detailed description thereof will be omitted in the present invention.

In this way, since the state information calculation unit 100 calculates the state information for each battery cell, it is possible to know an actual usable capacity of the entire battery pack even when there is a deviation in the state for each battery cell.

The cell selection unit 200 is a component that uses the state information of each of the battery cells received from the state information calculation unit 100 and selects the at least one battery cell of the high-risk group.

More specifically, the cell selection unit 200 may calculate a maximum voltage change amount of a plurality of battery cells, calculate a voltage threshold value as a reference for selecting at least one battery cell of a high-risk group by using the maximum voltage change amount, and select the at least one battery cell of the high-risk group based on the voltage threshold value.

Meanwhile, the battery management system 1000 of the present invention may further include a current calculation unit 300 for calculating a maximum current limit value that prevents the battery cell from being out of an operating voltage range.

In the following, the cell selection unit 200 and the current calculation unit 300 will be described by dividing the case where the battery pack is charged and the case where the battery pack is discharged with further reference to FIGS. 4 to 7.

Figure 4:
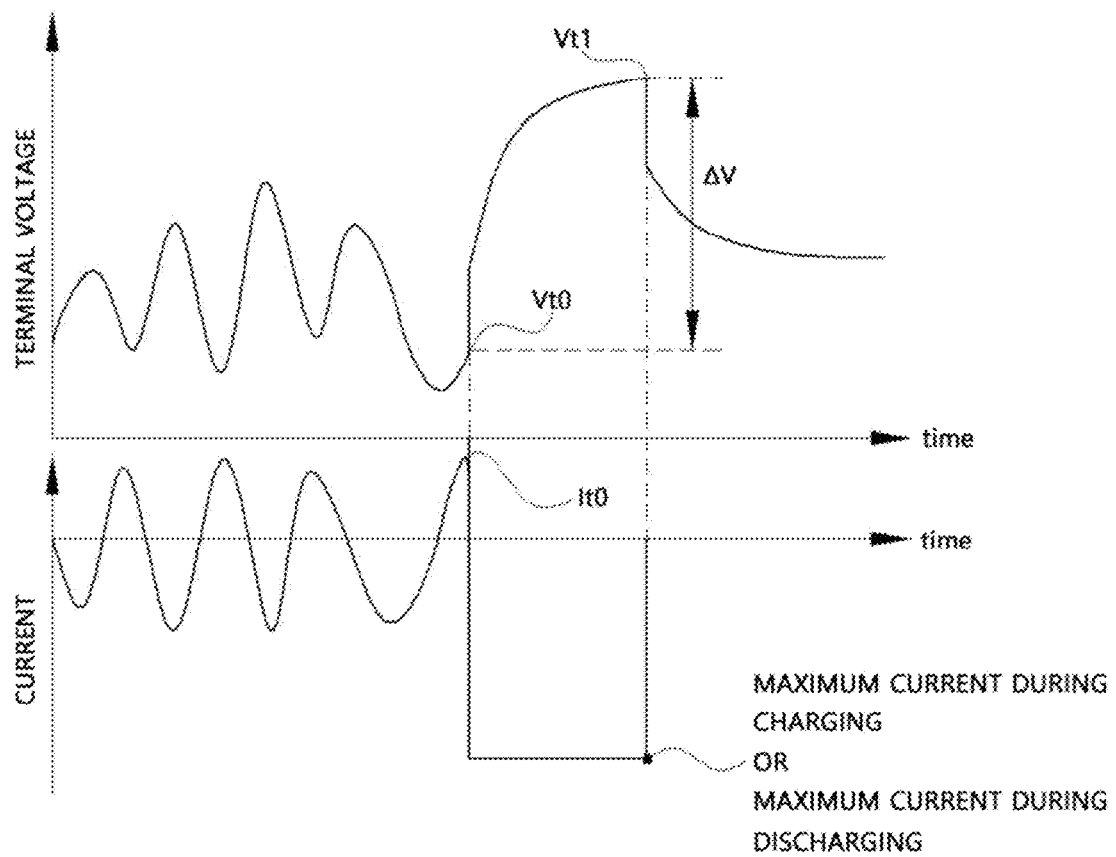
FIG. 4 is a diagram illustrating a change amount of a terminal voltage of a battery cell when a maximum current flows through a battery pack.
Figure 5:
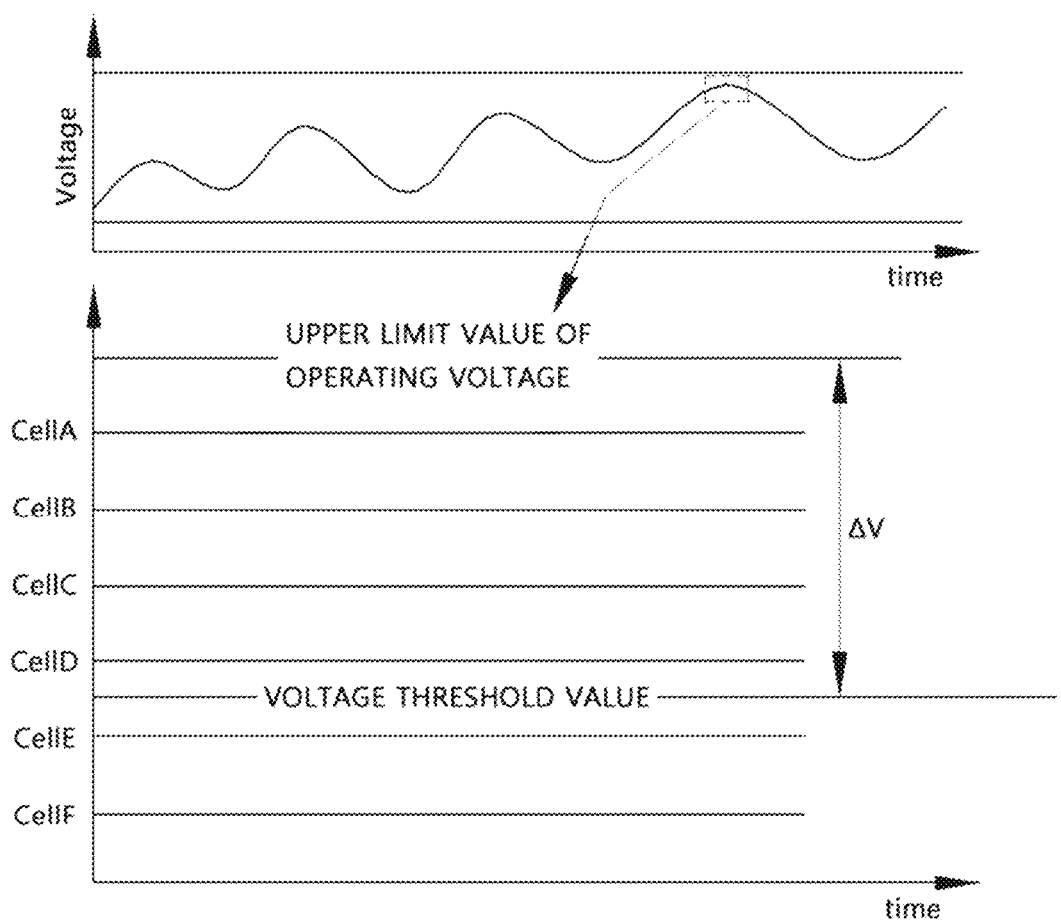
FIG. 5 is a diagram illustrating an example of selecting at least one battery cell of a high-risk group during charging.
Figure 6:
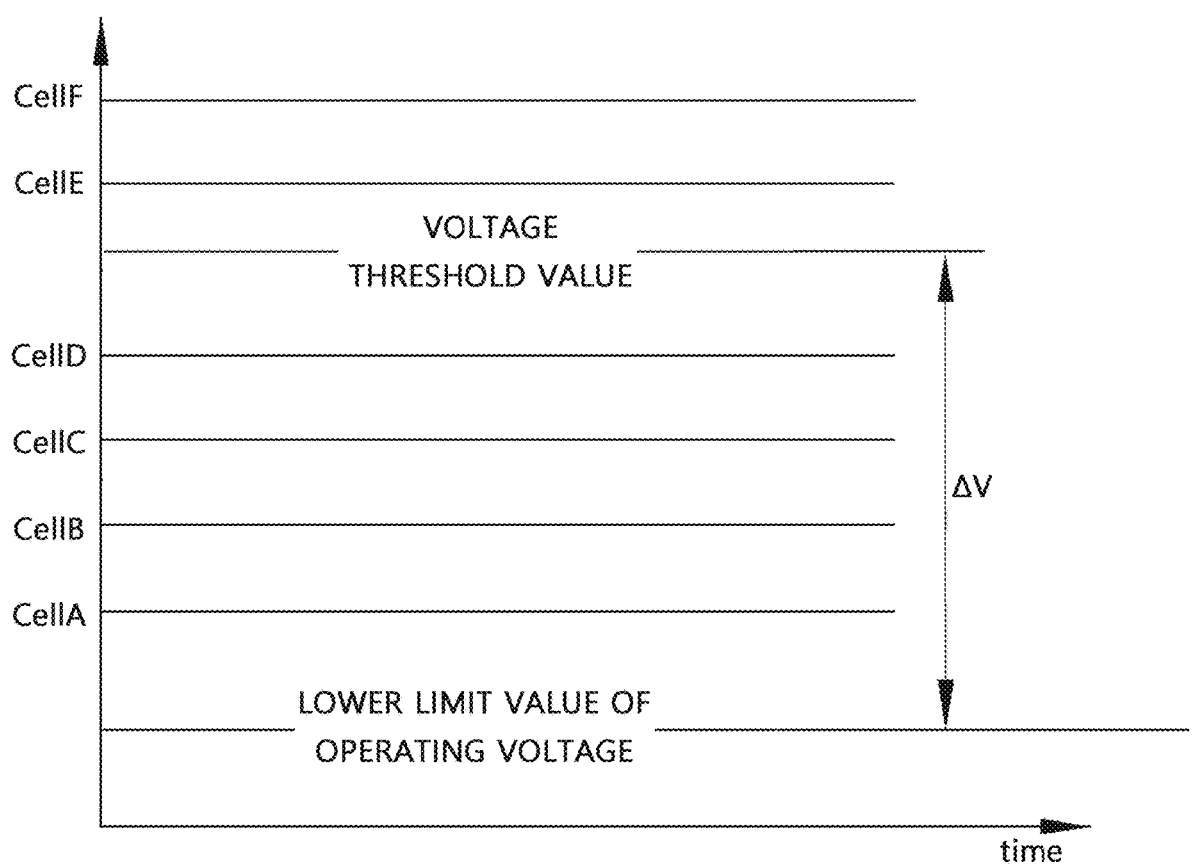
FIG. 6 is a diagram illustrating an example of selecting at least one battery cell of a high-risk group during discharging.
Figure 7:
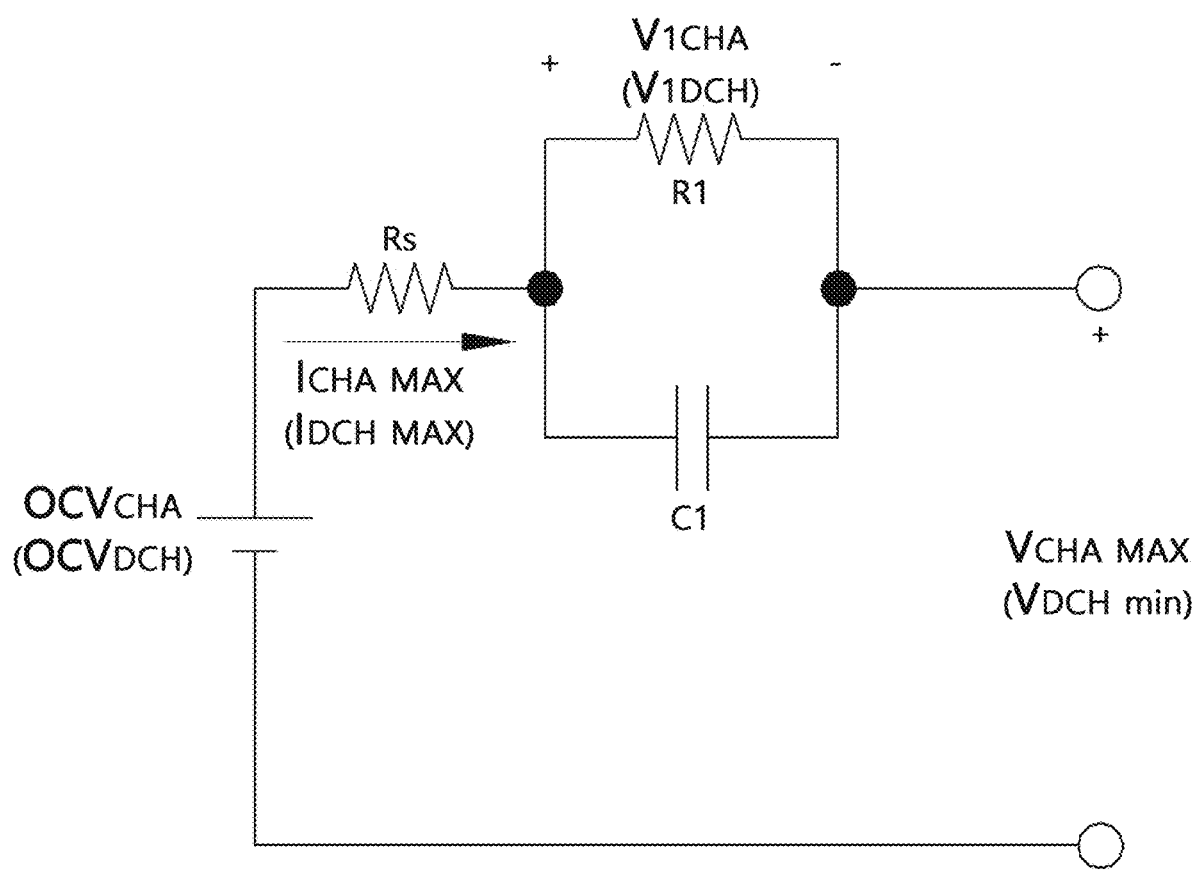
FIG. 7 is an equivalent circuit diagram of a battery cell.

FIG. 4 is a diagram illustrating a change amount of a terminal voltage of a battery cell when a maximum current flows through a battery pack, FIG. 5 is a diagram illustrating an example of selecting at least one battery cell of a high-risk group during charging, and FIG. 6 is a diagram illustrating an example of selecting at least one battery cell of a high-risk group during discharging. FIG. 7 is an equivalent circuit diagram of a battery cell.

1. Case where the Battery Pack is Charged

The cell selection unit 200 calculates a maximum charging voltage change amount by using a difference value between a current open terminal voltage and an open terminal voltage when fully charged of a battery cell having the lowest state of health (SoH) among the plurality of battery cells, an internal resistance value of a battery cell having the largest internal resistance among the plurality of battery cells, and a maximum current that may flow through the plurality of battery cells during charging.

At this time, the maximum current that may flow through the plurality of battery cells during charging is a value that varies depending on the battery specifications. For example, the maximum current during charging is −200 A, which may be pre-stored in the cell selection unit 200.

Here, referring to FIG. 4, if a maximum current ($I_{CHA}$) that may flow through the battery pack (or battery cell) during charging flows for some reason at a time point t0 during charging flows, a terminal voltage change amount of the battery cell becomes the maximum, and the voltage change amount at this time is called a maximum charging voltage change amount ($\Delta V_{CHA}$). This may be calculated by the following Equation 1.

$$\Delta V_{CHA} = \Delta OCV_{CHA} + I_{CHA} \times R_s \quad \text{[Equation 1]}$$

Here, an Open Circuit Voltage (OCV) refers to an open terminal voltage of the battery cell, and $\Delta OCV$ is a change amount of the open terminal voltage of the battery cell. The OCV is a value that matches the SoC and may be pre-stored in the cell selection unit 200.

At this time, $\Delta OCV_{CHA}$ is preferably a difference value between a current OCV of the battery cell having the lowest SoH and the open terminal voltage when fully charged. The reason is because a battery cell having a lower SoH is in a state in which deterioration due to driving is the most advanced or the internal resistance is high due to a tolerance or defect at the time of manufacture, and therefore, the terminal voltage change amount of the battery cell may be changed to the largest range when charged with the same current.

That is, the cell selection unit 200 may receive the SoC and SoH calculated by the state information calculation unit 100 and calculate the current OCV of the battery cell having the lowest SoH, and since the OCV when fully charged is a value that matches 100% SoC, the cell selection unit 200 may obtain $\Delta OCV_{CHA}$ by subtracting the OCV matching 100% SoC from the OCV matching the SoC of the battery cell having the lowest SoH.

$I_{CHA}$ is the maximum current that may flow through the battery cell during charging, and as described above, such a value is substituted for −200 A.

$R_s$ is an internal resistance value of the battery cell calculated by the state information calculation unit 100, and it is preferable to substitute the internal resistance value of the battery cell having the largest internal resistance. The reason is that, as a battery cell having a larger internal resistance is charged with the same current, the terminal voltage change amount of the battery cell may change to the largest range.

In other words, by substituting values that cause the maximum charging voltage change amount to have the maximum value for each parameter of Equation 1, the largest voltage change amount that may be assumed may be calculated. Thereby, when selecting at least one battery cell of a high-risk group to be described later, all battery cells having a risk of out of the operating voltage range may be selected.

In addition, the cell selection unit 200 may calculate a charging voltage threshold value by adding the calculated maximum charging voltage change amount ($\Delta V_{CHA}$) to an upper limit value (for example, 4.2 V) of the operating voltage, and may select battery cells having a terminal voltage that is less than the upper limit value of the operating voltage and greater than the charging voltage threshold value as at least one battery cell of a high-risk group.

For example, as illustrated in FIG. 5, the charging voltage threshold value is obtained by adding the upper limit value of the operating voltage and the maximum charging voltage change amount ($\Delta V_{CHA}$), and battery cells A, B, C, and D having a terminal voltage between the upper limit value of the operating voltage and the charging voltage threshold value may be selected as the at least one battery cell of the high-risk group.

The battery cell D will be described in more detail as an example. If the maximum current flows through the battery cell for some reason during charging and the voltage rises by the maximum charging voltage change ($\Delta V_{CHA}$), the terminal voltage exceeds the upper limit value of the operating voltage, which may cause deterioration of the battery cell. Likewise, since the battery cells A to C also have the same risk, the battery cells A to D are selected as the at least one battery cell of the high-risk group.

As described above, according to the present invention, the state information calculation unit 100 calculates the state information for each battery cell and the cell selection unit 200 calculates the maximum voltage change amount of the battery cell based on the state information, so that it is possible to predict whether there is a risk that the terminal voltage for each battery cell is out of the upper limit value of the operating voltage, and any of the battery cells may be managed so as not to be charged while exceeding the operating voltage by selecting the at least one battery cell of the high-risk group that has a risk of being out of the operating voltage.

In addition, when the current calculation unit 300 calculates the maximum current limit value, the value substituted for each parameter is selected from the selected at least one battery cell of the high-risk group, and therefore, the maximum current limit value may be accurately calculated.

In addition, when the current calculation unit 300 calculates the maximum current limit value, only the selected at least one battery cell of the high-risk group are considered, and therefore, excessive load may be prevented when calculating the maximum current limit value.

In addition, since the selected at least one battery cell of the high-risk group is battery cell that have a possibility of rapid deterioration among a plurality of battery cells constituting the battery pack, the at least one battery cell of the high-risk group among all battery cells included in the battery pack may be continuously managed as targets to be determined whether to be replaced first. That is, the battery pack may be efficiently maintained and managed.

Meanwhile, the current calculation unit 300 is a component that calculates a maximum charging current limit value for preventing the terminal voltage of each of the plurality of battery cells from being charged while exceeding the upper limit value of the operating voltage during charging.

Referring to FIG. 7, $R_s$ represents an internal resistance of the battery cell, $R_1$ represents a polarization resistance, and $C_1$ connected in parallel with $R_1$ represents a polarization capacitor. In addition, $V_1$ is a polarization voltage, which is a voltage generated by accumulation of polarization at a cathode and an anode when the battery is charged and discharged. $R_1$ and $C_1$ may be pre-stored in the current calculation unit 300 as preset values through an experiment.

The current calculation unit 300 may calculate the maximum charging current limit value through Equation 2 below using the at least one battery cell of the high-risk group selected by the cell selection unit 200.

$$I_{CHA_{max}} = \frac{OCV_{CHA} + \Delta OCV_{CHA} - V_{1\,CHA\,init} \times e^{-\frac{t}{R_1 C_1}} - V_{CHA_{max}}}{R_S + R_1 \times \left(1 - e^{-\frac{t}{R_1 C_1}}\right)} \quad \text{[Equation 2]}$$

In Equation 2, a current open terminal voltage of the battery cell having the largest state of charge (SoC) among the selected at least one battery cell of the high-risk group is substituted for $OCV_{CHA}$.

A value obtained by subtracting an open terminal voltage when fully charged from a current open terminal voltage of a battery cell having the smallest SoH among the selected at least one battery cell of the high-risk group is substituted for $\Delta OCV_{CHA}$.

A polarization voltage of a battery cell having the largest current terminal voltage is substituted for $V_{1\,CHA\,init}$.

The upper limit value of the operating voltage of the battery cell is substituted For $V_{CHA\,max}$.

$I_{CHA\,max}$ is the maximum current limit value during charging calculated from Equation 2 above.

t is the time (sec), for example, if the maximum current limit value is calculated in units of 10 seconds, 10 is substituted.

An internal resistance value of a battery cell having a maximum internal resistance is substituted for $R_s$, and an average value of the battery cells is substituted for $R_1$ and $C_1$.

In Equation 2, the maximum current limit value ($I_{CHA\,max}$) is calculated assuming that the terminal voltage reaches the upper limit value ($V_{CHA\,max}$) of the operating voltage when a current flows for t seconds from a current time point, and the maximum current limit value having the maximum margin may be calculated by selecting and substituting the value of the battery cell having the worst condition for each parameter as described above. If the maximum current limit value is calculated to have the maximum margin, then no battery cell is out of the operating voltage range. That is, an accuracy of the calculated maximum current limit value is guaranteed.

2. Case where Battery Pack is Discharged

The cell selection unit 200 calculates a maximum discharging voltage change amount by using a difference value between a current open terminal voltage and an open terminal voltage when fully discharged of a battery cell having the lowest state of health (SoH) among the plurality of battery cells, an internal resistance value of a battery cell having the largest internal resistance among the plurality of battery cells, and a maximum current that may flow through the plurality of battery cells during discharging.

At this time, the maximum current that may flow through the plurality of battery cells during discharging is a value that varies depending on the battery specifications. For example, the maximum current during discharging is 400 A, which may be pre-stored in the cell selection unit 200.

Here, referring to FIG. 4, if a maximum current ($I_{DCH}$) that may flow through the battery pack (or battery cell) during discharging for some reason at a time point t0 during discharging flows, a terminal voltage change amount of the battery cell becomes the maximum, and the voltage change amount at this time is called a maximum discharging voltage change amount ($\Delta V_{DCH}$). This may be calculated by the following Equation 3.

$$\Delta V_{DCH} = \Delta OCV_{DCH} + I_{DCH} \times R_s \quad \text{[Equation 3]}$$

At this time, $\Delta OCV_{DCH}$ is preferably a difference value between a current OCV of the battery cell having the lowest SoH and the open terminal voltage when fully discharged. The reason is because a battery cell having a lower SoH is in a state in which deterioration due to driving is the most advanced or the internal resistance is high due to a tolerance or defect at the time of manufacture, and therefore, the terminal voltage change amount of the battery cell may be changed to the largest range when discharged with the same current.

That is, the cell selection unit 200 may receive the SoC and SoH calculated by the state information calculation unit 100 and calculate the current OCV of the battery cell having the lowest SoH, and since the OCV when fully discharged is a value that matches 0% SoC, the cell selection unit 200 may obtain $\Delta OCV_{DCH}$ by subtracting the OCV matching 0% SoC from the OCV matching the SoC of the battery cell having the lowest SoH.

$I_{DCH}$ is the maximum current that may flow through the battery cell during discharging, and as described above, such a value is substituted for 400 A.

$R_s$ is an internal resistance value of the battery cell calculated by the state information calculation unit 100, and it is preferable to substitute the internal resistance value of the battery cell having the largest internal resistance. The reason is that, as a battery cell having a larger internal resistance is discharged with the same current, the terminal voltage change amount of the battery cell may change to the largest range.

In other words, by substituting values that cause the maximum discharging voltage change amount to have the maximum value for each parameter of Equation 3, the largest voltage change amount that may be assumed may be calculated. Thereby, when selecting at least one battery cell of a high-risk group to be described later, all battery cells having a risk of out of the operating voltage range may be selected.

In addition, the cell selection unit 200 may calculate a discharging voltage threshold value by adding the calculated maximum discharging voltage change amount ($\Delta V_{DCH}$) to a lower limit value (for example, 2.7 V) of the operating voltage, and may select battery cells having a terminal voltage that is greater than the lower limit value of the operating voltage and less than the discharging voltage threshold value as at least one battery cell of a high-risk group.

For example, as illustrated in FIG. 6, the discharging voltage threshold value is obtained by adding the lower limit value of the operating voltage and the maximum discharging voltage change amount ($\Delta V_{DCH}$), and battery cells A, B, C, and D having a terminal voltage between the lower limit value of the operating voltage and the discharging voltage threshold value may be selected as the at least one battery cell of the high-risk group.

The battery cell A will be described in more detail as an example. If the maximum current flows through the battery cell for some reason during discharging and the voltage drops by the maximum discharging voltage change ($\Delta V_{DCH}$), the terminal voltage is discharged to be less than the lower limit value of the operating voltage, which may cause deterioration of the battery cell. Likewise, since the battery cells B to D also have the same risk, the battery cells A to D are selected as the at least one battery cell of the high-risk group.

As described above, according to the present invention, the state information calculation unit 100 calculates the state information for each battery cell and the cell selection unit 200 calculates the maximum voltage change amount of the battery cell based on the state information, so that it is possible to predict whether there is a risk that the terminal voltage for each battery cell is out of the lower limit value of the operating voltage, and any of the battery cells may be managed so as not to be discharged to be less than the operating voltage by selecting the at least one battery cell of the high-risk group that has a risk of being out of the operating voltage.

In addition, when the current calculation unit 300 calculates the maximum current limit value, the value substituted for each parameter is selected from the selected at least one battery cell of the high-risk group, and therefore, the maximum current limit value may be accurately calculated.

In addition, when the current calculation unit 300 calculates the maximum current limit value, only the selected at least one battery cell of the high-risk group are considered, and therefore, excessive load may be prevented when calculating the maximum current limit value.

Meanwhile, the current calculation unit 300 may calculate a maximum discharging current limit value for preventing the terminal voltage of each of the plurality of battery cells from being discharged to be less than the lower limit value of the operating voltage during discharging.

The current calculation unit 300 may calculate the maximum discharging current limit value through Equation 4 below.

$$I_{DCH_{max}} = \frac{OCV_{DCH} + \Delta OCV_{DCH} - V_{1\,DCH\,init} \times e^{-\frac{t}{R_1 C_1}} - V_{DCH_{min}}}{R_S + R_1 \times \left(1 - e^{-\frac{t}{R_1 C_1}}\right)}$$ [Equation 4]

In Equation 4, a current open terminal voltage of the battery cell having the smallest SoC among the selected at least one battery cell of the high-risk group is substituted for $OCV_{DCH}$.

A value obtained by subtracting an open terminal voltage when fully discharged from a current open terminal voltage of a battery cell having the smallest SoH among the selected at least one battery cell of the high-risk group is substituted for $\Delta OCV_{DCH}$.

A polarization voltage of a battery cell having the smallest current terminal voltage is substituted for $V_{1\,DCH\,init}$.

The lower limit value of the operating voltage of the battery cell is substituted For $V_{DCH\,min}$.

$I_{DCH\,max}$ is the maximum current limit value during discharging calculated from Equation 4 above.

t is the time (sec), for example, if the maximum current limit value is calculated in units of 10 seconds, 10 is substituted.

An internal resistance value of a battery cell having a maximum internal resistance is substituted for $R_s$, and an average value of the battery cells is substituted for $R_1$ and $C_1$.

In Equation 4, the maximum current limit value ($I_{DCH\,max}$) is calculated assuming that the terminal voltage reaches the lower limit value ($V_{DCH\,min}$) of the operating voltage when a current flows for t seconds from a current time point, and the maximum current limit value having the maximum margin may be calculated by selecting and substituting the value of the battery cell having the worst condition for each parameter as described above. If the maximum current limit value is calculated to have the maximum margin, then no battery cell is out of the operating voltage range. That is, an accuracy of the calculated maximum current limit value is guaranteed.

Table 1 below illustrates the battery cells selected by the current calculation unit 300 to calculate the maximum current limit value, divided into the case of charging and the case of discharging.

TABLE 1

| Parameter | During charging | During discharging |
|---|---|---|
| OCV | Battery cell having maximum SoC | Battery cell having minimum SoC |
| ΔOCV | Battery cell having minimum SoH | |

TABLE 1-continued

| Parameter | During charging | During discharging |
| --- | --- | --- |
| $V_{1\ init}$ | Battery cell having maximum terminal voltage | Battery cell having minimum terminal voltage |

Figure 8:
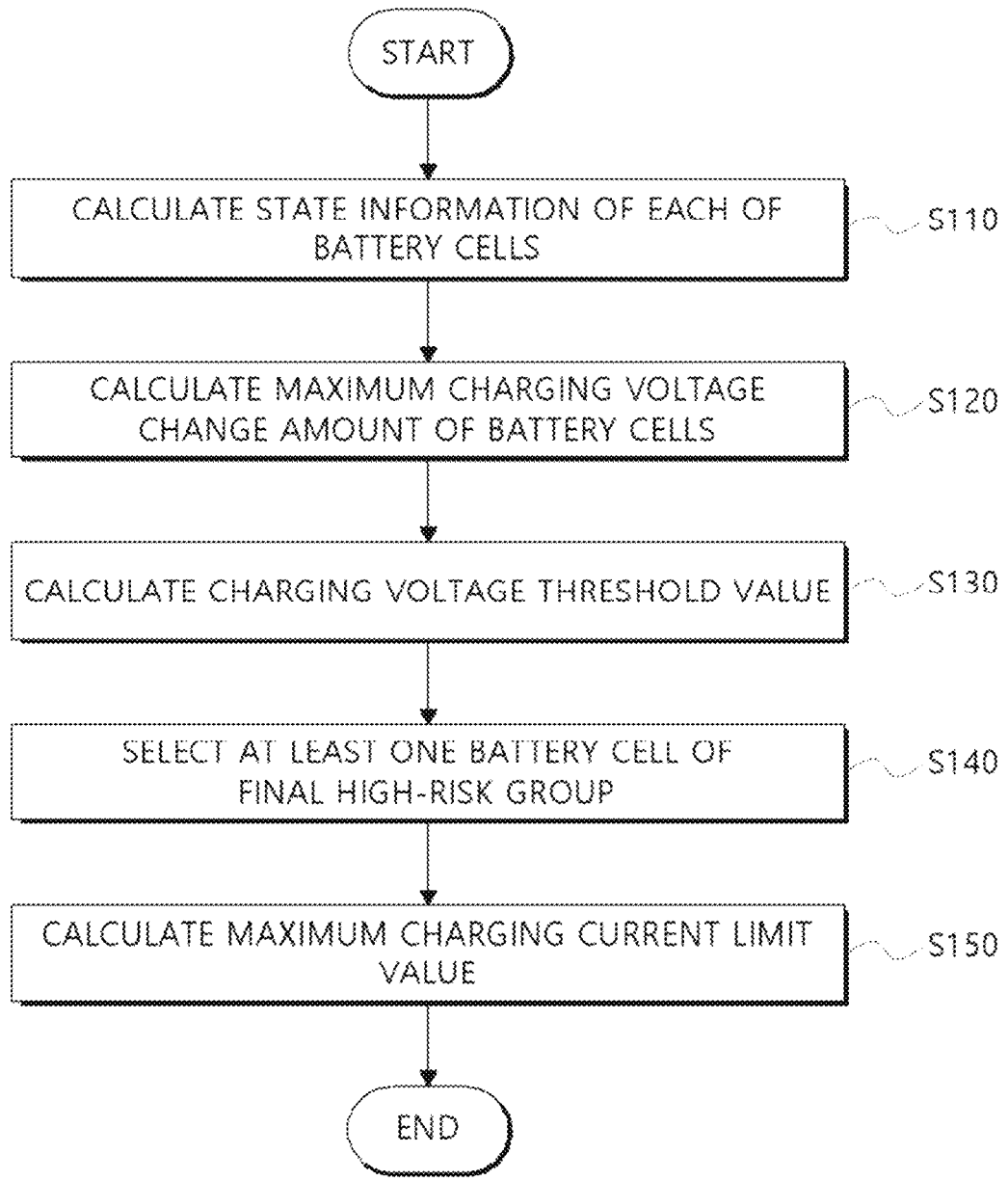
FIG. 8 is a flowchart illustrating a first embodiment in which a battery pack is charged in a battery management method according to the present invention.

Meanwhile, FIG. 8 is a flowchart illustrating a first embodiment in which a battery pack 20 is charged in a battery management method according to the present invention, and the battery management method according to the first embodiment of the present invention may be performed by the battery management system 1000 described above.

Referring to FIG. 8, in the battery management method according to the first embodiment of the present invention, first, state information of each of the plurality of battery cells constituting the battery pack 20 is calculated (S110).

At this time, this step (S110) is performed by the state information calculation unit 100, and the state information calculation unit 100 may receive at least one of the voltage of each of the battery cells included in the battery pack 20, the current of the battery pack 20, and the temperature of the battery pack 20 from the battery pack 20, and may calculate at least one of a SoC, a SoH, and an internal resistance of each of the battery cells as the state information.

Next, a maximum charging voltage change amount of the plurality of battery cells is calculated by using the state information (S120).

At this time, a maximum charging voltage change amount ($\Delta V_{CHA}$) may be calculated through Equation 1 above by using a difference value ($\Delta OCV_{CHA}$) between a current open terminal voltage and an open terminal voltage when fully charged of a battery cell having the lowest state of health (SoH) among the plurality of battery cells, an internal resistance value ($R_s$) of a battery cell having the largest internal resistance among the plurality of battery cells, and a maximum current ($I_{CHA}$) that may flow through the plurality of battery cells during charging.

Next, a charging voltage threshold value serving as a reference (criterion) for selecting the at least one battery cell of the high-risk group is calculated using the maximum charging voltage change amount (S130).

At this time, a value obtained by adding the maximum charging voltage change amount to the upper limit value of the operating voltage may be calculated as the charging voltage threshold value.

Finally, the at least one battery cell of the high-risk group having a risk of being charged while exceeding the upper limit value of the operating voltage is selected based on the charging voltage threshold value (S140).

At this time, battery cells having a terminal voltage less than the upper limit value of the operating voltage and greater than the charging voltage threshold value may be selected as the at least one battery cell of the high-risk group.

The steps S120 to S140 described above may be performed by the cell selection unit 200 described above.

In addition, the battery management method according to the present invention may further include, after the step (S140) of selecting the at least one battery cell of the high-risk group, a step (S150) of calculating a charging maximum current limit value for preventing the terminal voltage of each of the plurality of battery cells from being charged while exceeding the upper limit value of the operating voltage during charging.

At this time, the maximum charging current limit value ($I_{CHA\ max}$) may be calculated through Equation 2 above by using a current open terminal voltage ($OCV_{CHA}$) of a battery cell having the largest SoC among the selected at least one battery cell of the high-risk group, a difference value ($\Delta OCV_{CHA}$) between the current open terminal voltage and the open terminal voltage when fully charged of a battery cell having the smallest SoH, and a polarization voltage ($V_{1\ CHA\ init}$) of a battery cell having the largest terminal voltage.

FIG. 9 is a flowchart illustrating a second embodiment in which a battery pack 20 is discharged in a battery management method according to the present invention, and the battery management method according to the second embodiment of the present invention may be performed by the battery management system 1000 described above.

Referring to FIG. 9, in the battery management method according to the second embodiment of the present invention, first, state information of each of the plurality of battery cells constituting the battery pack 20 is calculated (S210).

At this time, this step (S210) is performed by the state information calculation unit 100, and the state information calculation unit 100 may receive at least one of the voltage of each of the battery cells included in the battery pack 20, the current of the battery pack 20, and the temperature of the battery pack 20 from the battery pack 20, and may calculate at least one of a SoC, a SoH, and an internal resistance of each of the battery cells as the state information.

Next, a maximum discharging voltage change amount of the plurality of battery cells is calculated by using the state information (S220).

At this time, a battery cell having the lowest SoH among the plurality of battery cell may be selected and a maximum discharging voltage change amount ($\Delta V_{DCH}$) may be calculated through Equation 3 above by using a difference value ($\Delta OCV_{DCH}$) between a current open terminal voltage and an open terminal voltage when fully discharged of the selected battery cell, an internal resistance value ($R_s$) of a battery cell having the largest internal resistance among the plurality of battery cells, and a maximum current ($I_{DCH}$) that may flow through the plurality of battery cells during discharging.

Next, a discharging voltage threshold value serving as a criterion for selecting the at least one battery cell of the high-risk group is calculated using the maximum discharging voltage change amount (S230).

At this time, a value obtained by adding the maximum discharging voltage change amount to the lower limit value of the operating voltage may be calculated as the discharging voltage threshold value.

Finally, the at least one battery cell of the high-risk group having a risk of being discharged to be less than the lower limit value of the operating voltage is selected based on the discharging voltage threshold value (S240).

At this time, battery cells having a terminal voltage greater than the lower limit value of the operating voltage and less than the discharging voltage threshold value may be selected as the at least one battery cell of the high-risk group.

The steps S220 to S240 described above may be performed by the cell selection unit 200 described above.

In addition, the battery management method according to the present invention may further include, after the step (S240) of selecting the at least one battery cell of the high-risk group, a step (S250) of calculating a discharging maximum current limit value for preventing the terminal voltage of each of the plurality of battery cells from being discharged to be less than the lower limit value of the operating voltage during discharging.

At this time, the maximum discharging current limit value ($I_{DCH\ max}$) may be calculated through Equation 4 above by using a current open terminal voltage ($OCV_{DCH}$) of a battery cell having the smallest SoC among the selected at least one battery cell of the high-risk group, a difference value ($\Delta OCV_{DCH}$) between the current open terminal voltage and the open terminal voltage when fully discharged of a battery cell having the smallest SoH, and a polarization voltage ($V_{1\ DCH\ init}$) of a battery cell having the smallest terminal voltage.

In addition, a more detailed description of the battery management method according to the first and second embodiments of the present invention may be replaced with the above description of the battery management system 1000 according to the present invention.

As described above, the state information calculation unit 100 receives the voltage of each of the plurality of battery cells, and calculates the state information for each battery cell by using the received voltage, thereby making it possible to calculate an actual usable capacity of an entire battery pack according to a deviation for each battery cell.

Further, according to the present invention, the cell selection unit 200 may calculate the maximum voltage change amount of the plurality of battery cells using the state information calculated for each battery cell, and the at least one battery cell of the high-risk group that has the possibility of being out of the upper value or the lower limit value of the operating voltage may be selected using the calculated maximum voltage change amount.

Further, according to the present invention, the current calculation unit 300 may calculate a high-accuracy maximum current limit value having a maximum margin by calculating the maximum current limit value by selecting and substituting the value of the battery cell having the worst condition for each parameter in calculating the maximum current limit value.

According to the present invention, the state information calculation unit receives the voltage of each of the plurality of battery cells, and calculates the state information for each battery cell by using the received voltage, so that even when there is a deviation for each battery cell, the actual usable capacity of the entire battery pack may be known.

Further, according to the present invention, the cell selection unit may calculate the maximum voltage change amount of the plurality of battery cells using the state information calculated for each battery cell, and the at least one battery cell of the high-risk group that has the possibility of being out of the upper value or the lower limit value of the operating voltage may be selected and managed using the calculated maximum voltage change amount.

Further, according to the present invention, the current calculation unit may calculate a high-accuracy maximum current limit value having a maximum margin by calculating the maximum current limit value by selecting and substituting the value of the battery cell having the worst condition for each parameter in calculating the maximum current limit value.

Although the present invention has been described by the limited embodiments and drawings, the present invention is not limited to the above embodiments, and various modifications and variations are possible from these descriptions by those of ordinary skill in the field to which the present invention pertains. Therefore, the spirit of the present invention should be understood only by the claims, and all of the equivalences and equivalent modifications to the claims are intended to fall within the scope and spirit of the present invention.

DETAILED DESCRIPTION OF MAIN ELEMENTS 10, 1000: Battery management system
11, 100: State information calculation unit
200: Cell selection unit
12, 300: Current calculation unit

What is claimed is:

1. A battery management system comprising:
   a state information calculation unit configured to calculate state information of each of a plurality of battery cells; and
   a cell selection unit configured to select at least one battery cell of a high-risk group using the state information,
   wherein the at least one battery cell of the high-risk group includes a battery cell having a terminal voltage that is out of an operating voltage during a charge or a discharge, and
   the cell selection unit calculates a maximum voltage change amount of the plurality of battery cells, calculates a voltage threshold value serving as a reference for selecting the at least one battery cell of the high-risk group by using the maximum voltage change amount, and selects the at least one battery cell of the high-risk group based on the voltage threshold value.

2. The battery management system of claim 1, wherein the state information calculation unit receives at least one of a voltage of each of the battery cells, a current of the battery pack, and a temperature of the battery pack from the battery pack, and calculates at least one of a state of charge (SoC), a state of health (SoH), and an internal resistance of each of the battery cells as the state information.

3. The battery management system of claim 2, wherein the cell selection unit calculates a maximum charging voltage change amount by using a difference value between a current open terminal voltage and an open terminal voltage when fully charged of a battery cell having the lowest SoH among the plurality of battery cells, an internal resistance value of a battery cell having the largest internal resistance among the plurality of battery cells, and a maximum current that flows through the plurality of cells during charging, calculates a value obtained by adding the maximum charging voltage change amount to an upper limit value of the operating voltage as a charging voltage threshold value, and selects at least one battery cell having a terminal voltage smaller than the upper limit value and greater than the charging voltage threshold value as the at least one battery cell of the high-risk group.

4. The battery management system of claim 2, further comprising a current calculation unit configured to calculate a maximum charging current limit value for preventing the terminal voltage of each of the plurality of battery cells from being charged while exceeding the upper limit value of the operating voltage during charging,
   wherein the current calculation unit calculates the maximum charging current limit value by using a current open terminal voltage of a battery cell having the largest SoC among the selected at least one battery cell of the high-risk group, a difference value between a current open terminal voltage and an open terminal voltage when fully charged of a battery cell having the smallest SoH, and a polarization voltage of a battery cell having the largest terminal voltage.

5. The battery management system of claim 2, wherein the cell selection unit selects a battery cell having the lowest SoH among the plurality of battery cell, calculates a maximum discharging voltage change amount by using a difference value between a current open terminal voltage and an open terminal voltage when fully discharged of the selected battery cell, an internal resistance value of a battery cell having the largest internal resistance among the plurality of battery cells, and a maximum current that flows through the plurality of battery cells during discharging, calculates a value obtained by adding the maximum discharging voltage change amount to a lower limit value of the operating voltage as a discharging voltage threshold value, and selects at least one battery cell having a terminal voltage greater than the lower limit value and smaller than the discharging voltage threshold value as the at least one battery cell of the high-risk group.

6. The battery management system of claim 2, further comprising a current calculation unit configured to calculate a maximum discharging current limit value for preventing the terminal voltage of each of the plurality of battery cells from being less than a lower limit value of the operating voltage during discharging, wherein the current calculation unit calculates the maximum discharging current limit value by using a current open terminal voltage of a battery cell having the smallest SoC among the selected at least one battery cell of the high-risk group, a difference value between a current open terminal voltage and an open terminal voltage when fully discharged of a battery cell having the smallest SoH, and a polarization voltage of a battery cell having the smallest terminal voltage.

7. A battery management method, the method comprising:
calculating state information of each of a plurality of battery cells;
calculating a maximum voltage change amount of the plurality of battery cells by using the state information;
calculating a voltage threshold value serving as a reference for selecting the least one battery cell of a high-risk group by using the maximum voltage change amount; and
selecting the at least one battery cell of the high-risk group based on the voltage threshold value,
wherein the at least one battery cell of the high-risk group includes a battery cell having a terminal voltage that is out of an operating voltage during a charge or a discharge.

8. The battery management method of claim 7, wherein in the calculating of the state information of each of the plurality of battery cells, at least one of a voltage of each of the battery cells, a current of the battery pack, and a temperature of the battery pack is received from the battery pack, and at least one of a state of charge (SoC), a state of health (SoH), and an internal resistance of each of the battery cells is calculated as the state information.

9. The battery management method of claim 8, wherein in the calculating of the maximum voltage change amount, a maximum charging voltage change amount is calculated by using a difference value between a current open terminal voltage and an open terminal voltage when fully charged of a battery cell having the lowest SoH among the plurality of battery cells, an internal resistance value of a battery cell having the largest internal resistance among the plurality of battery cells, and a maximum current that flows through the plurality of cells during charging.

10. The battery management method of claim 9, wherein in the calculating of the voltage threshold value, a value obtained by adding the maximum charging voltage change amount to an upper limit value of the operating voltage is calculated as a charging voltage threshold value.

11. The battery management method of claim 10, wherein in the selecting of the at least one battery cell of the high-risk group, at least one battery cell having a terminal voltage smaller than the upper limit value and greater than the charging voltage threshold value is selected as the at least one battery cell of the high-risk group.

12. The battery management method of claim 8, further comprising, after the selecting of the at least one battery cell of the high-risk group, calculating a maximum charging current limit value for preventing the terminal voltage of each of the plurality of battery cells from being charged while exceeding the upper limit value of the operating voltage during charging.

13. The battery management method of claim 12, wherein in the calculating of the maximum current limit value, the maximum charging current limit value is calculated by using a current open terminal voltage of a battery cell having the largest SoC among the selected at least one battery cell of the high-risk group, a difference value between a current open terminal voltage and an open terminal voltage when fully charged of a battery cell having the smallest SoH, and a polarization voltage of a battery cell having the largest terminal voltage.

14. The battery management method of claim 8, wherein in the calculating of the maximum voltage change amount, a battery cell having the lowest SoH among the plurality of battery cell is selected, and a maximum discharging voltage change amount is calculated by using a difference value between a current open terminal voltage and an open terminal voltage when fully discharged of the selected battery cell, an internal resistance value of a battery cell having the largest internal resistance among the plurality of battery cells, and a maximum current that flows through the plurality of battery cells during discharging.

15. The battery management method of claim 14, wherein in the calculating of the voltage threshold value, a value obtained by adding the maximum discharging voltage change amount to a lower limit value of the operating voltage is calculated as a discharging voltage threshold value.

16. The battery management method of claim 15, wherein in the selecting of the at least one battery cell of the high-risk group, at least one battery cell having a terminal voltage greater than the lower limit value and smaller than the discharging voltage threshold value is selected as the at least one battery cell of the high-risk group.

17. The battery management method of claim 8, further comprising, after the selecting of the at least one battery cell of the high-risk group, calculating a maximum discharging current limit value for preventing the terminal voltage of each of the plurality of battery cells from being less than a lower limit value of the operating voltage during discharging.

18. The battery management method of claim 17, wherein in the calculating of the maximum current limit value, the maximum discharging current limit value is calculated by using a current open terminal voltage of a battery cell having the smallest SoC among the selected at least one battery cell of the high-risk group, a difference value between a current open terminal voltage and an open terminal voltage when fully discharged of a battery cell having the smallest SoH, and a polarization voltage of a battery cell having the smallest terminal voltage.

* * * * *